United States Patent
Romano

(10) Patent No.: US 6,194,978 B1
(45) Date of Patent: Feb. 27, 2001

(54) INTERRUPT MODULATION METHOD AND APPARATUS

(76) Inventor: Harry A. Romano, 5072 28th Pl., S.W., Naples, FL (US) 34116

( * ) Notice: Subject to any disclaimer, the term of this patent is extended or adjusted under 35 U.S.C. 154(b) by 0 days.

(21) Appl. No.: 09/125,990
(22) PCT Filed: Apr. 7, 1997
(86) PCT No.: PCT/US97/05765
§ 371 Date: Aug. 28, 1998
§ 102(e) Date: Aug. 28, 1998
(87) PCT Pub. No.: WO97/38490
PCT Pub. Date: Oct. 16, 1997

Related U.S. Application Data

(60) Provisional application No. 60/015,006, filed on Apr. 8, 1996.

(51) Int. Cl.$^7$ ............... H03C 1/00; H03D 1/08; H03D 1/10; H04L 27/02; H04L 27/04
(52) U.S. Cl. ............ 332/107; 332/106; 329/311; 329/370; 455/259; 455/295
(58) Field of Search ................ 332/100–102, 332/106–116; 329/311–314, 300–303, 370; 360/30; 370/212, 213, 281, 295, 302, 313, 343; 375/238, 239, 303–307, 353, 259, 295; 455/49.1, 105, 106, 116, 229, 337

(56) References Cited

U.S. PATENT DOCUMENTS

| | | |
|---|---|---|
| 2,466,959 | 4/1949 | Moore . |
| 2,968,010 | 1/1961 | Case, Jr. . |
| 3,401,359 | 9/1968 | Becker . |
| 3,559,117 | 1/1971 | Sugimoto . |
| 3,772,614 | 11/1973 | Kjaersgaard . |
| 3,919,641 | 11/1975 | Kurokawa et al. . |
| 4,118,598 | * 10/1978 | Risko et al. .................... 325/26 |
| 4,185,241 | 1/1980 | Ewanus et al. . |
| 4,320,361 | 3/1982 | Kikkert . |
| 4,485,359 | * 11/1984 | Talbot .......................... 332/31 T |
| 4,529,950 | * 7/1985 | Chazenfus et al. ............. 332/9 T |
| 4,653,068 | * 3/1987 | Kadin .................................. 375/1 |
| 4,866,737 | 9/1989 | Seifried . |
| 5,151,698 | 9/1992 | Pophillat . |
| 5,249,201 | 9/1993 | Posner et al. . |
| 5,303,265 | 4/1994 | McLean . |
| 5,418,818 | 5/1995 | Marchetto et al. . |
| 5,589,838 | * 12/1996 | McEwan ......................... 342/387 |
| 6,026,125 | * 2/2000 | Larrick, Jr. et al. ............. 375/295 |

OTHER PUBLICATIONS

Hatfield, L.E.; "Frequency–Shift RadioTransmission"; *Procire vol. 36, No. 1*; Jan. 1948; pp. 116–120.*

* cited by examiner

*Primary Examiner*—David Mis

(57) ABSTRACT

The invention is directed toward a simple and cost effective method of wirelessly transmitting digital information with an analog carrier signal. The method, referred to as Interrupt Modulation IM, will allow broadcasters to make the transition from an analog to a digital format while using existing analog equipment and conserving radio spectrum. Interrupt Modulation consists of allowing digital information to be transmitted to control a high speed analog special interrupter circuit which interrupts the circuit path of an unmodulated carrier signal such that the analog carrier is interrupted to directly correspond with the time length of the high segment of the digital pulse wave. Digital information is then transferred by the absence of the analog carrier signal. As modern high speed analog switches are capable of on/off operation at speeds of several megahertz, which is common in digital information computers, throughout rates of up to 100 megabits per second are obtainable.

9 Claims, 7 Drawing Sheets

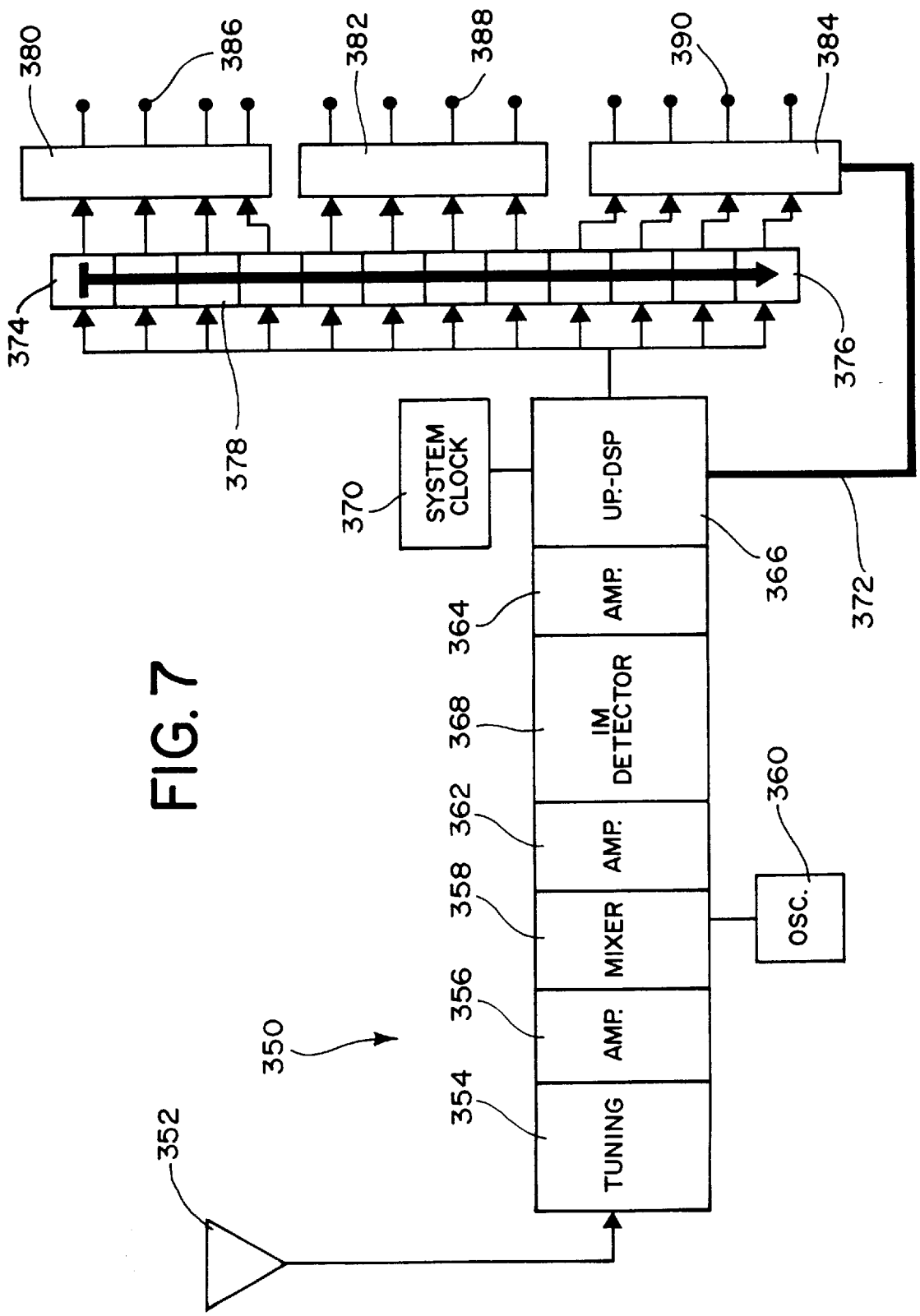

INTERRUPT MODULATION METHOD AND APPARATUS

This application claims benefit to provisional application 60/015,006 filed Apr. 8, 1996.

TECHNICAL FIELD

The present invention relates to a method and apparatus for efficiently transmitting digital information with an analog carrier for wireless communications. More specifically, this invention relates to a method of interrupting an analog carrier so that the absence of the carrier directly corresponds to the digital information being transmitted.

BACKGROUND OF THE INVENTION

In the past most wireless communication systems used either frequency modulation (FM) and/or amplitude modulation (AM) to embed analog information within a carrier frequency. In recent years digital information has been transmitted using the same modulation techniques or derivatives of those techniques.

When using either AM, FM or a combined AM/FM modulation technique the carrier frequency is the center point of the overall bandwidth which the signal occupies. Due to the modulation of information onto the carrier frequency the modulated carrier signal occupies bandwidth above and below the carrier frequency. Because the allocation of the radio spectrum is fixed only a limited number of signals can be transmitted in the allotted radio bandwidth.

A number of modern digital technologies increase the overall flow of information transmitted within a given segment of the radio spectrum by using data compression, information packeting, and other digital formats and modulation schemes. While signal throughput and integrity are increased these technologies continue to rely on modulation techniques which occupy sections of bandwidth. The same radio spectrum bandwidth limitations described above again limit the number of signals or channels of information that can be wirelessly transmitted.

Therefore, in light of the foregoing deficiencies in the prior art, the applicant's invention is herein presented.

SUMMARY OF THE INVENTION

The present invention provides a method and apparatus for wirelessly transmitting and receiving digital information using an analog carrier where the required bandwidth is limited to approximately the frequency of the analog carrier signal. The method is called interrupt modulation and consists of interrupting an un-modulated carrier signal so the interruptions correspond directly to the digital information to be transmitted. The digital information is used to control a high speed analog switch which either passes or blocks the un-modulated carrier signal thereby converting the digital information to time domain information. In the preferred embodiment the un-modulated analog carrier signal is interrupted to directly correspond with the time length of the high segments of the digital information.

To receive and demodulate or decode the digital information wirelessly transmitted the interrupt modulated signal is rectified to create a digital pulse waveform that represents the original digital information only inverted. Once the digital pulse waveform is detected it can easily be conditioned and inverted to identically match the digital information originally transmitted. Digital information is transferred by the time lengths of the absence of the analog carrier signal. Due to reliance on the absence of the carrier or absence information, interrupt modulation provides substantial self-filtering with any additional filtering needed capable of being done simply and inexpensively. The absence information provided by interrupt modulation alleviates or eliminates many conventional wireless problems such as multipath interference, signal drop off and imaging distortion.

These along with other objects and advantages of the present invention will become more readily apparent from a reading of the detailed description taken in conjunction with the drawings and the claims.

BRIEF DESCRIPTION OF THE DRAWINGS

FIG. 7 is a block diagram of an alternate embodiment of an interrupt modulation receiver including demultiplexing output circuitry.

DETAILED DESCRIPTION OF THE PREFERRED EMBODIMENT

Figure 1:
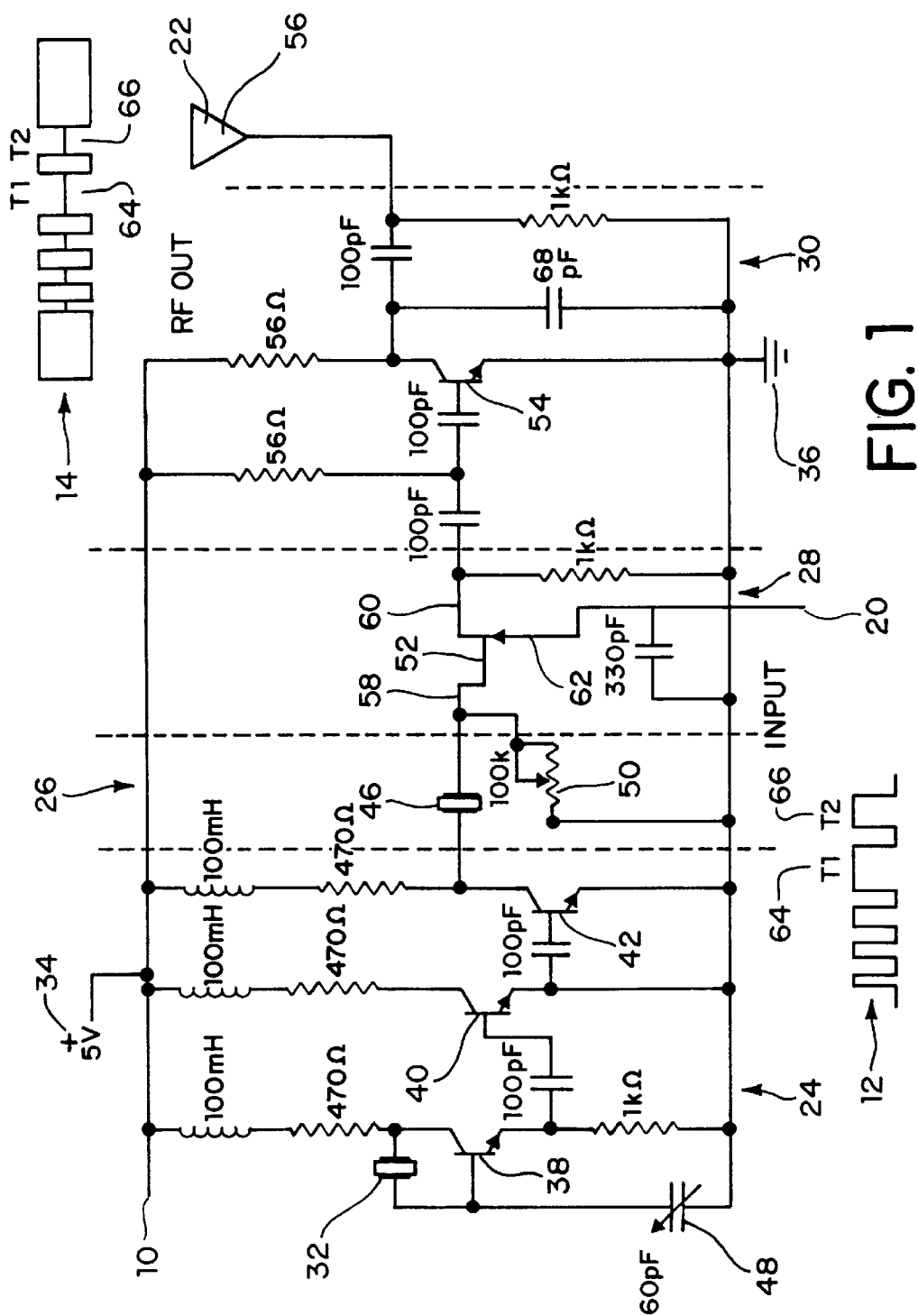
FIG. 1 is a schematic diagram of a transmitter employing interrupt modulation.

The present invention is directed towards a simple and cost effective method of wirelessly transmitting digital information with an analog carrier signal. The method, referred to as Interrupt Modulation, will allow broadcasters to make the transition from an analog to a digital format while using existing analog equipment and radio frequency spectrum. Interrupt Modulation consists of allowing digital information to be transmitted to control a high speed analog switch which interrupts the circuit path of an unmodulated carrier signal such that the analog carrier signal is interrupted to directly correspond with the time length of the high segment of the digital pulse wave form. Digital information is then transferred by the absence of the analog carrier signal. Stated another way, the unmodulated analog carrier signal is absent whenever the digital information is high and the carrier signal is present whenever the digital information is low. The length of time of analog carrier absence or presence is directly proportional to the length of time the digital pulse waveform remains high or low. Using Interrupt Modulation, more accurate and longer range signal transmission and reception is obtainable because the digital information resides in the true absence of the analog carrier signal as compared to other modulation techniques which depend on more finite changes in the carrier such as in amplitude (AM) or frequency (FM) modulation. Due to its reliance on absence information, reception of interrupt modulated signals is not influenced by the signal strength and is not affected by intermittent fluctuations in signal strength.

One of the greatest advantages provided by interrupt modulation is that information is transmitted only within the bandwidth in which the unmodulated analog carrier signal resides. Modulation techniques found in the prior art such as AM and FM create signals which occupy not only the bandwidth required for the unmodulated analog carrier but also bandwidth space above and below that of the carrier resulting in an increased use of the available radio spectrum. This limits the number of radio signals which can be transmitted with a given frequency allocation. Interrupt modulation is ideally suited to handle societies increased dependence on wireless communications.

Another significant advantage provided by interrupt modulation is greatly increased information transfer or throughput rates. Increased transfer rates are achieved by one bit representation of the original digital information. In essence, the information transfer rate is only limited by the speed at which the analog carrier frequency can be interrupted. As modern high speed analog switches are capable of on/off operation at speeds of several megahertz, which is common in digital information generated by modern computers, throughput rates up to 100 megabits per second are obtainable. In fact, due to the switching speeds being hundreds of times faster than the frequency of typically transmitted analog information interrupt modulation can be used in conjunction with signals modulated by other methods, such as FM, in order to transfer digital information and analog information using a single analog carrier.

In the preferred embodiment the analog carrier is interrupted approximately twenty-five percent of the time, leaving the analog carrier on for approximately seventy-five percent of the time. While the analog carrier can be interrupted a greater percentage of its on time, it has been found that information throughput is significantly enhanced. This proceedure significantly improves noise immunity over the prior art. The advantage is that receeption of the analog carrier improves due to the increased presence of the analog carrier. If the analog carrier is at a high enough frequency throughput rates of up to 100 mega bits per second and greater can be obtained.

Although interrupt modulation will described primarily in relation to binary digital information, it is in no way limited to binary data. Because the length of time of the analog carrier's absence and presence is directly proportional to the length of time of the high segment of the information to be transmitted, interrupt modulation converts information into a time domain signal. In other words, the real value of the information does not have to just be in the number of absences and prescences of the analog carrier but instead can also be in the lengths of time of the absence and precense of the analog carrier. One example of such a use would be a remote control airplane in which only limited amounts of information need to be transmitted to control the airplane, i.e., turn left, turn right, ascend, descend. Using the time domain characteristics of interrupt modulation the airplane could simply receive abscence information and based on the length of the abscence determine one of the four states or commands. This same principle could be extended to eight, sixteen, or any number of different states or commands based upon the time lengths of the abscence information.

Turning to FIG. 1, a preferred embodiment of interrupt modulation transmitter 10 will be described in more detail. Although FIG. 1 shows a full schematic diagram of a working interrupt modulation transmitter the invention lies in the interruption of an unmodulated analog carrier signal by digital information. As such, any transmitter capable of generating a carrier signal in any frequency range and radiating the carrier signal into the atmosphere for eventual reception could be modified to employ interrupt modulation. One of ordinary skill in the art would recognize numerous configurations of electronic components which can generate a carrier signal, amplify the signal and radiate the signal into the atmosphere. In addition, each component and connection will not be described in detail as one of ordinary skill in the art would understand the components and connections immediately from the schematic diagram. With that in mind interrupt modulation transmitter 10 will now be described. Interrupt modulation or IM transmitter 10 is comprised of several sections of circuitry denoted by the vertical dashed lines with each section indicated by a reference numeral with an arrow.

The first section is buffered oscillator 24. Buffered oscillator 24 receives power through positive voltage supply 34 with voltage paths completed through ground 36. In fact, all portions of IM transmitter 10 receive power and ground through 34 and 36 respectively. Crystal 32 is coupled to first stage amplifier 38 and acts as a frequency oscillator when biased by variable capacitor 48 which also coupled to crystal 32. Because the sine wave generated by crystal 32 is extremely small in voltage amplitude the signal is fed to second stage amplifier 40 whose output is then fed to third stage amplifier 42 wherein each stage of amplification increases the generated sine waves voltage amplitude to a point where it is usable. The sine wave generated by buffered oscillator 24 is then fed to the second section of IM transmitter 10 that being precision sine wave oscillator 26. Section 26 consists of precision crystal 46 which receives the sine wave generated by buffered oscillator 24 and outputs a clean and stable sine wave, which in this embodiment is at a frequency of 16.9 MHZ. Coupled between ground and the output of precision crystal 46 variable resistor 50 provides an adjustable load for precision crystal 46 allowing minor adjustments to the sine wave output. The signal from precision crystal 46 is the unmodulated analog carrier which eventually will be radiated into the atmosphere for reception.

The third section of IM transmitter 10, interrupt modulator 28, is comprised of high speed field effect transistor (FET) 52 having the unmodulated analog carrier signal output from precision sine wave oscillator 26 coupled to drain 58 of FET 52. When FET 52 is on, the unmodulated analog carrier present at drain 58 will transfer through FET 52 and appear at source 60. When FET 52 is off, a potential of zero volts will exist at source 60 because FET 52 will prevent conduction of the unmodulated analog carrier. The state of FET 52, either on or off, is controlled by gate 62 which allows conduction if a positive voltage is present and prevents conduction if zero volts of potential is present. The state of FET 52 is controlled by the gate 62 and its attending components 50, 52, 58 and 60 which act in a compensating manner. One of ordinary skill in the art will recognize that substituting a P-channel FET for the N-channel FET shown in FIG. 1 would result in the control voltage of FET 52 being inverted so that zero volts at gate 62 allows conduction and a positive potential prevents conduction. In the preferred embodiment an N-channel FET is used for FET 52 as it requires fewer additional components for proper operation. Digital information input 20 is electrically coupled gate 62 of FET 52 with digital information 12 being shown adjacent input 20 in a time/amplitude format as if the signal was displayed on an oscilloscope. The signal that appears at source 60 is now an interrupt modulated analog carrier signal.

The fourth segment of IM transmitter 10 is amplifier 30 which is comprised of transistor 54 and a handful of discreet biasing components. Power amplifier 30 receives the interrupt modulated analog carrier from interrupt modulator 28, sufficiently amplifies the signal and then radiates the signal into the atmosphere through antenna 56 which is coupled to the output of power amplifier 30. The interrupt modulated analog carrier is shown at 14 in time/amplitude format as if displayed on an oscilloscope with the solid black portions representing the presence of the carrier signal.

By comparing digital information 12 with interrupt modulated analog carrier 14 it can be seen that while time periods 64 and 66 of digital information 12 are high the same time period 64 and 66 of interrupt modulated analog carrier 14 show the carrier being absent thereby providing absence information. Not only are digital highs and lows translated into absence or presence of the analog carrier but the absence and presence of the carrier directly correspond in time length to the digital highs and low time lengths.

Figure 2:
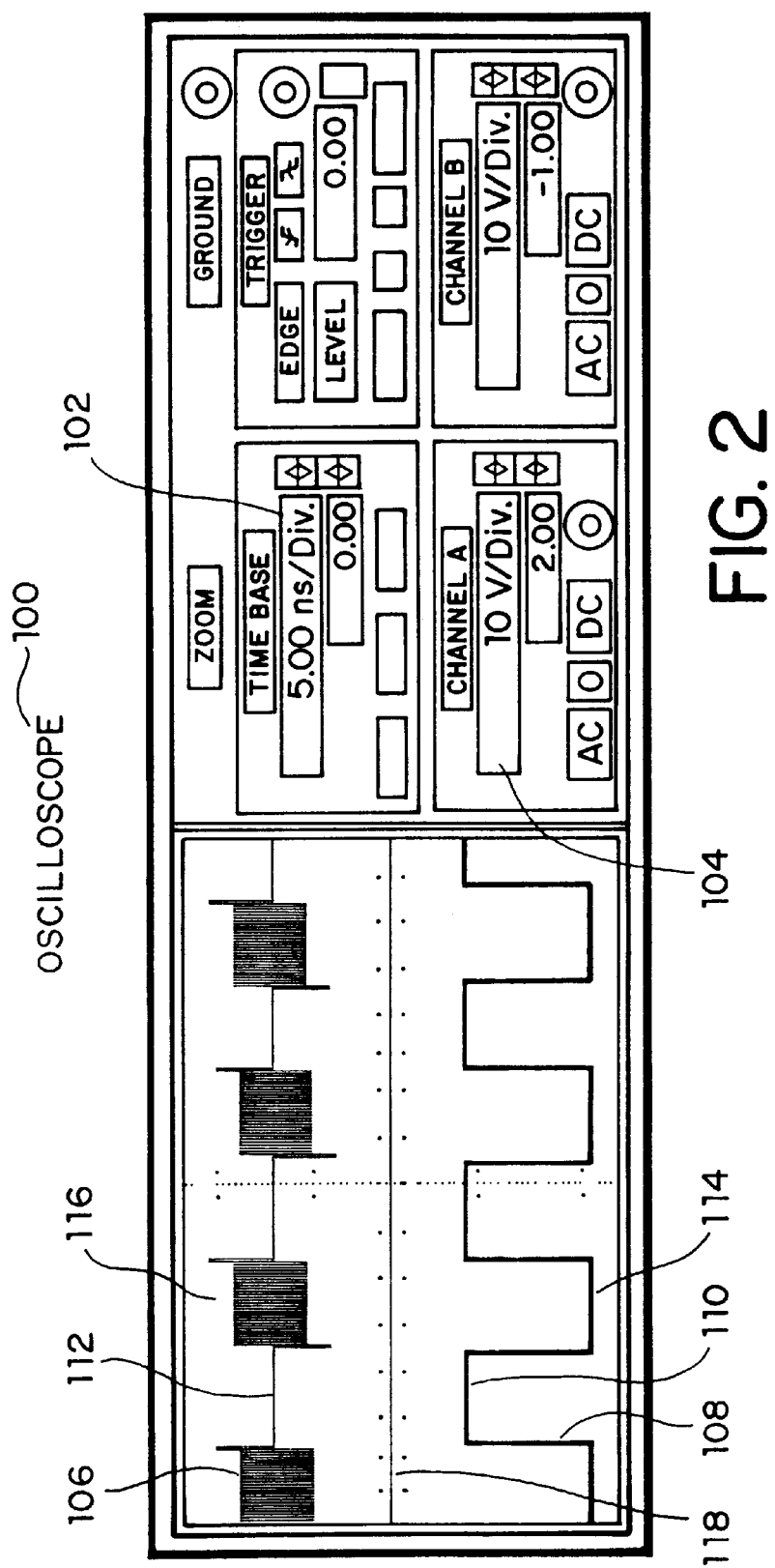
FIG. 2 is a front elevational view of an oscilloscope showing the relationship between an analog carrier frequency and digital information used to interrupt modulate the carrier.

Referring now to FIG. 2, a more detailed comparison of analog carrier 106 in relation to digital information 108 is shown on oscilloscope 100. It is to be understood that analog carrier 106 is being displayed on one channel of oscilloscope 100 while digital information 108 is being displayed on the second channel and both channels references are offset from horizontal reference line 118 of oscilloscope 100. As indicated at 104, oscilloscope 100 is set to display 10 volts per vertical division thereby indicating that the peak-to-peak voltages of both analog carrier 106 and digital information 108 are approximately 20 volts in amplitude. As indicated at 102, oscilloscope 100 is set to display 5 nano seconds per division which upon inspection of the wave forms shows that analog carrier 106 is at a frequency of approximately 900 MHZ the carrier is immaterial. IM or "interrupt modulation" is a modulation type, therefore any frequency can be modulated by using the IM technique and is being interrupted by digital information 108 varying at a frequency of approximately 50 MHZ. Again, when digital information 108 is in high state 110, analog carrier 106 is halted to create absence information 112. When digital information 108 is in low state 114, analog carrier 106 again becomes present as shown at 116.

Figure 3:
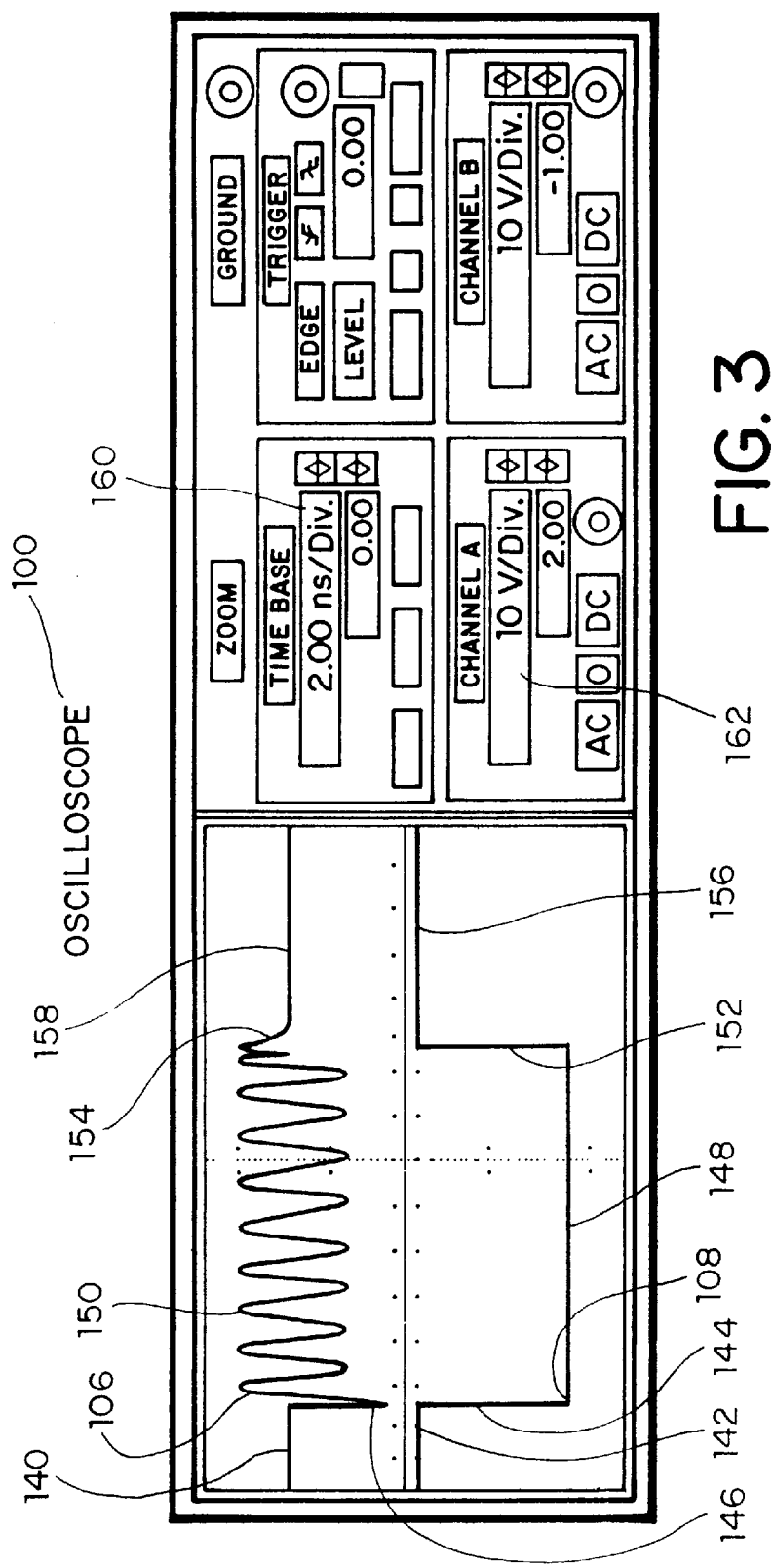
FIG. 3 is a front elevational view of an oscilloscope showing the relationship between a single pulse of digital information and the analog carrier frequency when interrupt modulation is used.

FIG. 3 shows the same signals again compared on oscilloscope 100 with the same volts per division setting 162 but with the units of time setting 160 adjusted for 2 nano seconds per horizontal division allowing for closer examination and comparison of the two signals. As shown in FIG. 2, when digital information 108 is in high state 142, analog carrier 106 is absent thereby creating periods of absence information 140. During the transition of digital information 108 from high state 142 to low state 148 trailing edge 144 occurs. During the transition of trailing edge 144, FET 52 shown in FIG. 1 goes from an off state to an on state which allows analog carrier 150 to be present. During the transition as analog carrier 150 becomes present, a bandwidth spike 146 occurs causing slight deviations in both voltage amplitude and frequency. The same is true during leading edge 152 as digital information 108 goes from low state 148 to high state 156 again creating absence information. Bandwidth spikes 146 and 154 cause slight bandwidth spreading above and below the center frequency of analog carrier 150 but this minor spread still allows interrupt modulation to transmit digital information at substantially the center frequency of analog carrier 150. With proper filtering, bandwidth spikes 146 and 154 can be substantially eliminated such that the interrupt modulated carrier signal only occupies the bandwidth of the unmodulated carrier signal.

Once interrupt modulated analog carrier 14 is in the atmosphere it must then be detected to complete the wireless communications link. With this in mind, interrupt modulation receiver 16, shown in FIG. 4, will now be described. IM receiver 16 is made up a number of sections and all but one of those sections are well known and used to receive common radio frequency signals modulated either by frequency or amplitude. As was done with FIG. 1, each component and connection will not be described in detail as one of ordinary skill in the art would understand the components and connections from the schematic diagram shown in FIG. 4. Also, because most of the circuitry is well known and can be implemented in a plurality of configurations, the minute details are not deemed important. With that in mind, IM receiver 16 will now be described. The first section of IM receiver 16 is front end 200 which is comprised of antenna 212 coupled to surface acoustic wave (SAW) filter 214, which then is coupled to low noise field effect transistor (FET) 218. Antenna 212 captures interrupt modulated analog carrier 14 as it propagates through the atmosphere and passes IM carrier 14 to an initial filter centered around SAW filter 214 which eliminates unwanted radio frequency signals other than carrier 14. When antenna 212 receives interrupt modulated carrier 14, the signal strength is extremely low due to attenuation in the atmosphere. Once carrier 14 has been filtered it is then coupled to low noise FET 218 for initial amplification to a usable signal value.

Front end 200 of IM receiver 16 is then coupled to the second stage of IM receiver 16, intermediate frequency or IM stage 202. IM stage 202 first amplifies the signal from front end 200 through transistor 228 and then passes the again amplified interrupt modulated carrier 14 to mixer 232. Also coupled to mixer 232 is local oscillator 230 which provides mixer 232 with a lower frequency input having a higher power level than IM carrier 14. Mixer 232 will combine the output of local oscillator 230 with IM carrier 14 to output an intermediate frequency (IF) which will be a single frequency having a substantially narrow bandwidth approximately equal to the carrier frequency. Once IF stage 202 derives the intermediate frequency it is then coupled to the next section of IM receiver 16, intermediate frequency (IF) amp 204. IF amp 204 simply provides further amplification of the intermediate frequency output from IF stage 202 and is comprised of two NPN transistors 234 and 236 arranged in a common two-stage amplifier configuration.

The next stage of IM receiver 16 is high gain amp 206 which is comprised of operational amplifier 242, variable biasing resistor 238 and gain adjustment variable resistors 240 and 244. By adjusting the ratio of variable feedback resistor 244 to variable input resistor 240, the input-to-output gain of op-amp 242 can be adjusted. The further amplified interrupt modulated intermediate frequency at the output of high gain amp 206 is coupled to interrupt modulation detector 208 and automatic gain control (AGC) 210. AGC 210 is comprised of op-amp 220, rectifier diodes 222 and 224 coupled to the output of op-amp 220 and variable resistor 226 which receives the rectified output of op-amp 220 which in turn is coupled to and controls current limiting field effect transistor (FET) 218. Based upon the strength of the output signal from high gain amp 206, op-amp 220 and its associated circuitry control the amount of current flow through FET 218 which in turn controls the current available to transistor 216 of front end 200. If after all the previous stages of amplification the output of high gain amp 206 is not at a sufficient magnitude AGC 210 will adjust the current level available to transistor 216 to allow for greater amplification from the beginning of the signal reception process.

The final stage of IM receiver 16 is interrupt modulation detector 208. Detector 208 derives the originally transmitted digital information from the intermediate frequency interrupt modulated signal present at the output of high gain amplifier 206. Interrupt modulation detector 208 is a full wave rectifier consisting of diodes 246 and 248 with any wave form ripple smoothed by filter capacitor 250 to reconstruct digital information in an inverted format. The inverted digital information is then coupled to NAND gate 252 which inverts and conditions the inverted information to produce digital information 12 which can then be coupled to a computer or other device through digital output 254.

Figure 4:
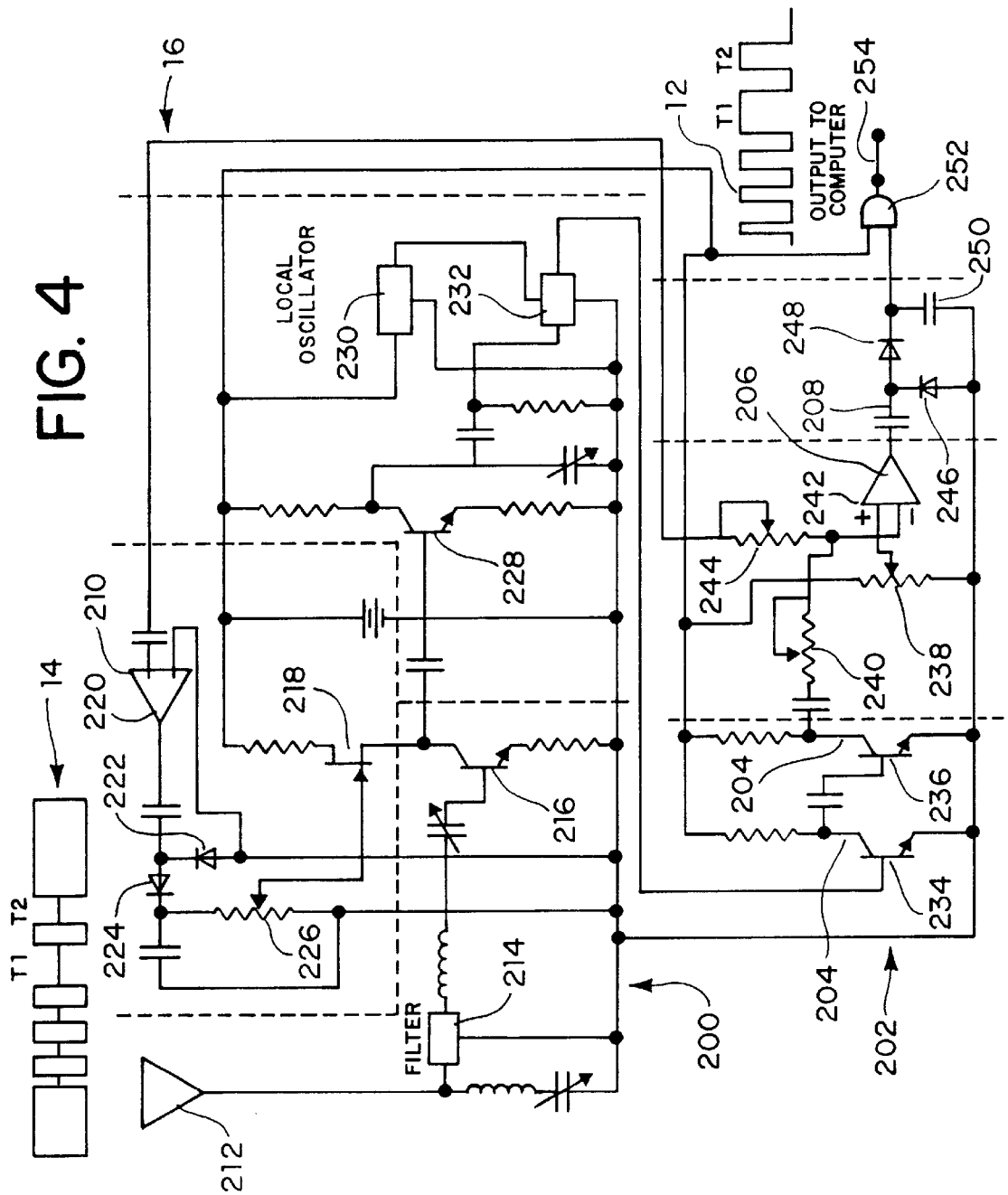
FIG. 4 is a schematic diagram of a receiver which detects and decodes interrupt modulated information.
Figure 5:
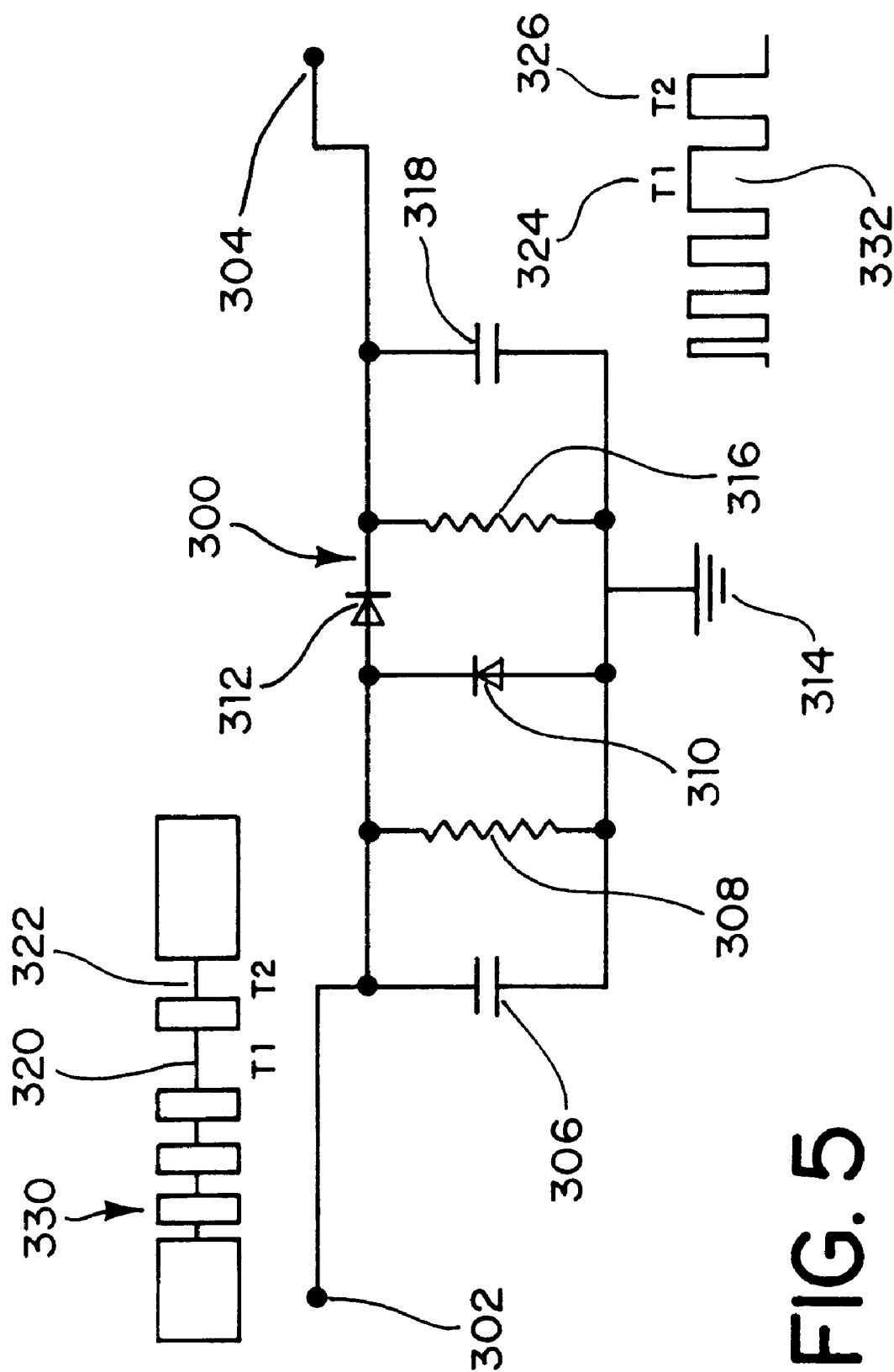
FIG. 5 is a schematic diagram of an alternate embodiment of the interrupt modulation detector included in the receiver of FIG. 4.

FIG. 5 shows an alternate embodiment in interrupt modulation detector 300 similar to that shown at 208 in FIG. 4. Detector 300 receives intermediate frequency interrupt modulated signal 330 at input 302. Capacitor 306 and resistor 308 provide minor signal conditioning while diodes 310 and 312 form a full wave rectifier so that at the cathode of diode 312 only positive going cycles of the intermediate frequency signal are present with the negative going cycles inverted and made positive to provide twice the number of positive cycles. This method of rectification is identical to that used in linear power supplies which convert alternating current to direct current. Resistor 316 provides additional conditioning with filter capacitor 318 smoothing the ripple voltage for the full wave rectified signals found at the cathode of diode 312. Filter capacitor 318 charges as the wave form goes positive and sources current as the wave form decreases towards zero volts to smooth the gaps in between increases and decreases of the analog signal. Once intermediate frequency interrupt modulated signal 330 is rectified it then is forwarded to output 304 of IM detector 300. It should be noted that the digital information extracted as shown at 332 is inverted as compared to the original digital information which was used to interrupt modulate the analog carrier. Comparing intermediate frequency IM signal 330 with the inverted digital signal 332 shows that due to absence information at 320 and 322 there is no carrier to be rectified thereby creating digital low states 324 and 326. To correct this output 304 can be coupled to an invertor or other logic gate which will further condition and invert the signal to produce the digital information originally transmitted.

Figure 6:
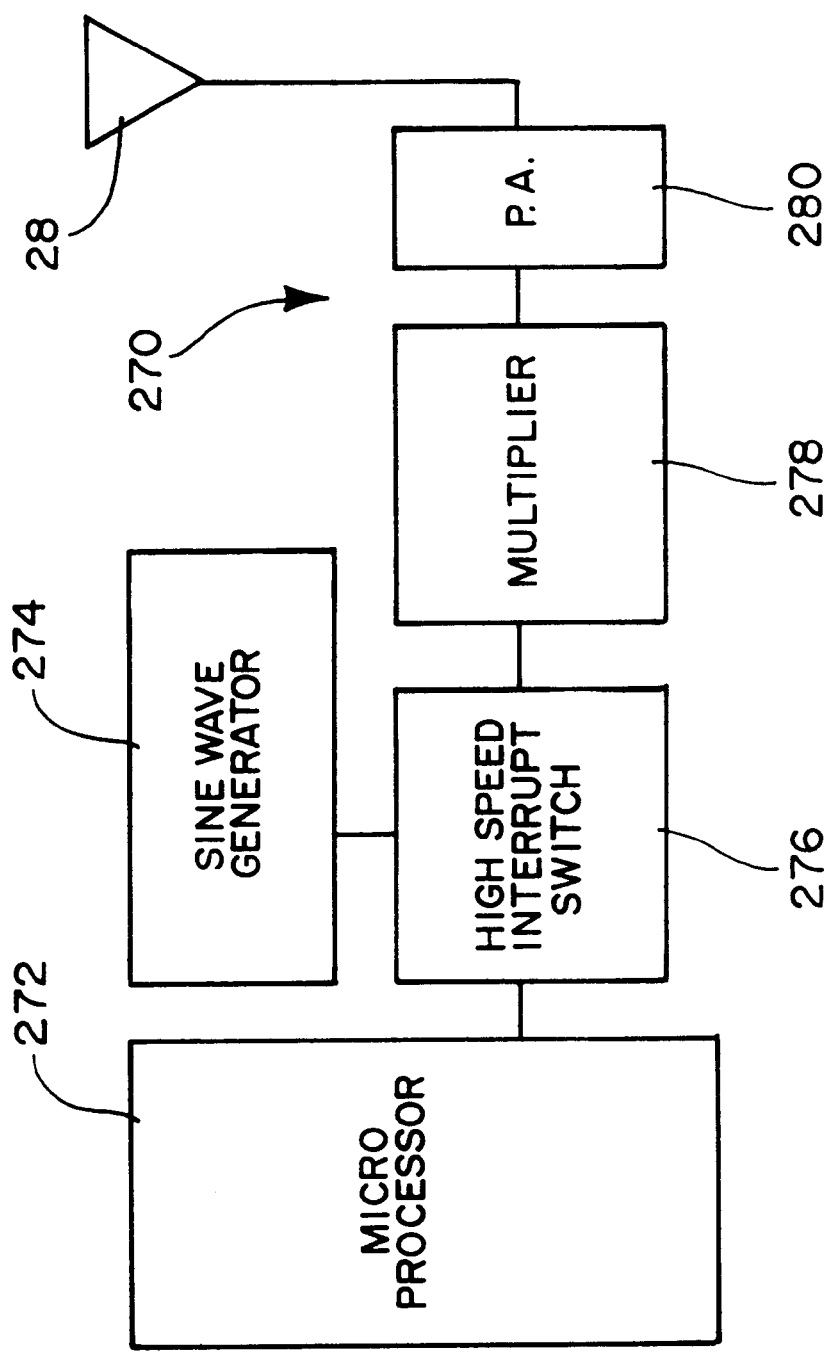
FIG. 6 is a block diagram of an alternate embodiment of an interrupt modulation transmitter controlled by a microprocessor.

FIG. 6 shows an alternate embodiment in interrupt modulation transmitter 270 which employs a microprocessor 272 to allow more advanced uses including multiplexing digital information to allow multiple discreet channels of information to be transmitted using a single carrier signal. Microprocessor 272 is coupled to high speed interrupt switch 276 to control switch 276 so that it either passes or blocks an unmodulated analog carrier produced by sine wave generator 274. The output of high speed interrupt switch 276 is then coupled to multiplier 278 thereby increasing the frequency of the interrupt modulated carrier which then sends the multiplied frequency to power amplifier 280. Amplifier 280 boosts the interrupt modulated analog carrier to a power magnitude sufficient to disperse the signal into the atmosphere through antenna 282 for detection by a receiver. Microprocessor 272 can also embed digital information with flags to enable a receiver to detect different channels of information. Although not shown, the microprocessor could receive numerous digital inputs and then multiplex them into a single stream of digital information having identifier flags thereby allowing multiple channels of information to be interrupt modulated and transmitted without taking up more bandwidth than that taken by the unmodulated carrier frequency of IM transmitter 270.

FIG. 7 shows an alternate embodiment in interrupt modulation receiver 350 adapted to receive and decode multiplexed digital information transmitted by IM transmitter 270 of FIG. 6. The interrupt modulated analog carrier propagating through the atmosphere is first received by antenna 352 which is coupled to front end 354 for initial reception. Amplifier 356 increases the signal strength which was attenuated during transmission through the atmosphere. The signal is then transferred to mixer 358 which combines the interrupt modulated carrier signal with the signal from local oscillator 360 to derive an intermediate frequency interrupt modulated signal which is again amplified at 362 and transferred to interrupt modulation detector 368. Detector 368 rectifies and filters the signal to create the transferred digital information in an inverted format. The inverted digital information output from IM detector 368 is again conditioned by amplifier 364 and coupled to microprocessor 366 which controls the demultiplexing of the various channels of information embedded within the received digital information. System clock 370 provides a time base for the microprocessor and associated digital circuits to maintain synchronization and is standard in all computers.

In the particular application shown in FIG. 7, the demultiplexing circuitry consists of a bank of digital-to-analog (D/A) converters 378 with only individual D/A converters 374 and 376 shown. The serial digital information transmitted to and received by IM receiver 350 is coupled in parallel to the inputs of each D/A converter in bank 378 with microprocessor 366 controlling which D/A converter is enabled based upon detection of channel flags within the serial digital information. Once the digital-to-analog converters of bank 378 receive information they then proceed to convert the digital information to an analog format which is passed to one of a number of analog switch banks 380, 382 and 384, also controlled by microprocessor 366. Analog signal outputs 386, 388, 390 of the bank of analog switches are also controlled by microprocessor 366. IM receiver 350 can demultiplex a number of analog channels which were converted to a digital format and transmitted in serial fashion, providing a plurality of voice channels within a single carrier's wave form bandwidth. It should also be understood that digital-to-analog banks 378 could be replaced with a wide variety of digital components if strictly digital information is being sent and received which then needs to be demultiplexed and forwarded to other equipment for data transfer or control functions.

As can be seen, interrupt modulation technology is extremely versatile and can be used in any application which requires digital information to be wirelessly transmitted. One such application which interrupt modulation is ideally suited is in wirelessly networking computer systems to replace the thousands of feet of coaxial cable used in local area networks throughout the world. The cost saved just from no longer using the coaxial cable would itself justify the investment and application of interrupt modulation technology.

It is to be understood that variations of materials, configurations and applications of the present invention are intended to fall within the scope of the claimed invention and that the subject invention is not to be limited by the specific apparatus or method of operation described and/or depicted by the drawings nor is the invention to be limited by the specific materials or electrical and mechanical components identified and described herein. These have been designated merely to provide a demonstration of operability and the selection of electrically and mechanically equivalent arrangements is not deemed a departure from the spirit of the invention being limited solely by the scope of the attached claims.

What is claimed is:

1. A method of modulating an analog carrier with digital information, which comprises the steps of passing said analog carrier through a compensated analog switch;

turning said analog switch off when said digital information is in a high state and turning said analog switch on when said digital information is in a low state;

establishing a transition period of carrier to no carrier of a duration between 2 to 10 nanoseconds or faster;

whereby said analog carrier is absent at the output of said analog switch when said digital information is in a high state and said analog carrier is present at the output of said analog switch when said digital information is in a low state thereby resulting in an interrupt modulated carrier; including the steps of equalizing the band width of the modulated carrier substantially to the band width of the analog carrier, and modulating said analog carrier with digital information at a rate of up to 100 megabits per second.

2. A method of modulating an analog carrier with digital information as recited in claim 1, wherein said analog carrier is interrupted by said digital information so that said analog carrier is only interrupted for approximately twenty-five percent of the duration of said analog carrier.

3. The method of claim 1 including the steps of demodulating said digital information by rectifying said interrupt analog carrier and then filtering said rectified interrupt modulated analog carrier to smooth the ripple voltage necessarily present as a result of the rectification, thereby recreating an inverted form of said digital information.

4. A method of demodulating digital information from an interrupt modulated analog carrier as recited in claim 3, wherein said interrupt modulated analog carrier is full wave rectified thereby inverting negative frequency cycles to provide twice the number of positive frequency cycles for filtering.

5. A method of demodulating digital information from an interrupt modulated analog carrier as recited in claim 3, which further comprises the steps of:

conditioning said inverted digital information so that it can be used by digital electronic devices; and inverting said conditioned digital information to restore said original digital information.

6. A method of modulating an analog carrier with digital information which comprises the steps of passing said analog carrier through a compensated analog switch;

turning said analog switch on when said digital information is in a high state and turning said analog switch off when said digital information is in a low state;

establishing a transition period of carrier to no carrier of a duration between 2 to 10 nanoseconds;

whereby said analog switch is off for the length of time said information is in a high state and said analog switch is on for the length of time said digital information is in a low state;

whereby said analog carrier is absent at the output of said analog switch for the length of time said digital information is in a high state and said analog carrier is present at the output of said analog switch for the length of time said digital information is in low state;

including the steps of equalizing the bandwidth of the modulated carrier substantially to the bandwidth of said analog carrier; and modulating said analog carrier with digital information at a rate of up to 100 megabits per second.

7. An apparatus for wirelessly transmitting information comprising:

an oscillator which generates an analog carrier;

at least one information source;

an interrupt modulator having an analog carrier input, an information input and an output, said analog carrier input is coupled to said at least one information source;

means for establishing a transition period from carrier to no carrier of a duration between 2 to 10 nanoseconds;

an amplifier coupled to said output of said interrupt modulator; and an antenna coupled to said output of said amplifier for radiating an interrupt modulated analog carrier into the atmosphere; including:

means for equalizing the bandwidth of said modulated analog carrier to the bandwidth of said analog carrier; and means for modulating said analog carrier at a rate of 100 megabits per second.

8. An apparatus for wirelessly transmitting information as recited in claim 7, wherein said interrupt modulator consists of an analog switch having an input, an output and a control input;

wherein said input of said analog switch is coupled to said output of said oscillator, said output of said analog switch is coupled to said amplifier and said control input is coupled to said at least one information source; and wherein said at least one information source controls whether said analog switch allows or discontinues conductance of said analog carrier into said amplifier.

9. An apparatus for wirelessly transmitting information as recited in claim 8, wherein said analog switch is a high speed transistor.

* * * * *